United States Patent [19]
Collins et al.

[11] Patent Number: 5,146,297
[45] Date of Patent: Sep. 8, 1992

[54] PRECISION VOLTAGE REFERENCE WITH LATTICE DAMAGE

[75] Inventors: Steven R. Collins, Lexington; Robert B. Johnson, Marlborough, both of Mass.

[73] Assignee: Raytheon Company, Lexington, Mass.

[21] Appl. No.: 783,432

[22] Filed: Oct. 25, 1991

[51] Int. Cl.⁵ .................................. H01L 29/90
[52] U.S. Cl. .............................. 357/13; 357/63; 357/67
[58] Field of Search .............. 357/13, 63, 67 S, 13 Z

[56] References Cited

U.S. PATENT DOCUMENTS

| | | | |
|---|---|---|---|
| 4,353,754 | 10/1982 | Yamanaka et al. | 357/63 X |
| 4,689,667 | 8/1987 | Aronowitz | 357/63 |
| 4,905,060 | 2/1990 | Chinone et al. | 357/63 X |
| 4,948,989 | 8/1990 | Spratt | 357/13 X |

FOREIGN PATENT DOCUMENTS

59-22368 2/1984 Japan .................. 357/13 Z

Primary Examiner—William Mintel
Attorney, Agent, or Firm—Richard M. Sharkansky

[57] ABSTRACT

A precision voltage reference device having a forward biased and reverse biased silicon junctions arranged as a concentric circular annular monolithic structure is described. Selective hardening of the forward biased junction is provided to adjust carrier lifetime in said junction thereby providing a radiation hardened device. The selective hardening is provided by implanting non-dopant species to induce a predetermined amount of lattice damage at the forward biased junction. This arrangement permits both the forward biased junction and the reverse biased junction to be fabricated on a common substrate.

18 Claims, 5 Drawing Sheets

PRECISION VOLTAGE REFERENCE WITH LATTICE DAMAGE

The Government has rights in this invention pursuant to Contract No. F04704-86-C-0160 awarded by the Department of the Air Force.

BACKGROUND OF THE INVENTION

This invention relates generally to semiconductor devices and, more particularly, to semiconductor devices used to provide a precise voltage for use as a stable, precise voltage reference.

As it is known in the art, precision voltage references (PVRs) are used in electronic systems which require a stable reference voltage. Circuits such as analog-to-digital and analog-to-frequency converters, calibration standards, and precise current and voltage sources generally require the use of precision voltage references. Moreover, in many military applications, precision voltage references must provide a voltage which remains within stringent limits after exposure to a specified radiation environment in order for the system employing such a device to fulfill its mission. In most instances with exposure to a radiation environment, the so-called fast neutron component of the environment is the primary concern. Other concerns, however, are total dose and dose rate effects of gamma and x-ray exposures on the precision voltage reference. Generally, exposure to such environments either can destroy a conventional precision voltage reference or more likely cause short-term, as well as permanent long-term variations in the reference voltage provided from such a device after exposure to the radiation environment. A second requirement is that often times the precision voltage reference must operate over varying temperature ranges and accordingly the device must be temperature compensated to maintain a substantially constant voltage over the operating temperature range of the device.

A conventional, precision voltage reference includes a reverse biased silicon avalanche diode which is typically soldered to a forward biased silicon junction. The temperature coefficients of the two diodes are large in magnitude but opposite in sign. By careful design and component selection, it is generally feasible to provide a composite device with a temperature coefficient smaller than 5 ppm/°C. The stability of the conventional precision voltage reference in a neutron radiation environment relies upon a compensating mechanism in the reverse biased and forward biased diodes. Fast neutrons incident on the silicon devices create clusters of displaced silicon atoms. In the avalanche reverse biased diode, the primary effect of these defect clusters of silicon atoms is to provide intermediate energy levels to remove majority carriers. As a result, a junction depletion layer, which is present in the reverse biased avalanche diode widens, and thus the avalanche voltage increases for a fixed terminal current. Neutron damage to the forward biased junction, however, provides a decrease in minority carrier lifetime which causes a decrease in the forward voltage drop or forward junction voltage across the junction as a function of increasing radiation. Generally, the variation in forward voltage caused by the decrease in minority carrier lifetime is substantially greater than the changes in reverse voltage caused by effective widening of the junction depletion region in the reverse biased diode. The radiation induced decrease in the forward biased junction voltage and hence in the PVR is mitigated in the conventional precision voltage reference by doping the junction with gold during the fabrication process to purposely reduce the minority carrier lifetime. At low levels of gold doping, the voltage stability of the device is limited by the strong decrease in the forward junction voltage with neutron radiation. As gold doping is increased, however, compensation over a broader range of neutron fluences, is provided.

One problem with the above-described device, however, is that neither the control of the gold doping process, nor the matching of the neutron fluence dependencies of the avalanche diode and the pn junction provide sufficient stability adequate for the most demanding modern military systems.

Another problem is that the gold doping process is not suitable for fabricating a monolithic device since it is not practical to confine the doping to a specific junction. Therefore, the conventional approach requires the separate fabrication of the diodes with their eventual hand soldering to provide a practical device. This approach is expensive, has low reliability, as well as low reproducibility.

SUMMARY OF THE INVENTION

In accordance with the present invention, a precision voltage reference includes a substrate, a first pn junction region disposed on said substrate, said first pn junction region comprising a layer of p-type doped material and a layer of n-type doped material with each of said layers disposed to provide said first pn junction. The first pn junction further comprises a selectively implanted non-dopant species disposed at the pn junction region which provides a predetermined amount of lattice damage at the interface of said p and n layers. The precision voltage reference further includes a second pn junction disposed on said substrate adjacent to said first pn junction and comprises a second layer of p material and a second layer of n material disposed with said p material to provide said second pn junction. A first one of said second p-type and second n-type layers of said second pn junction are electrically coupled to the respective one of said first p-type layer and first n-type layer of the first junction through said substrate. With such an arrangement, a precision voltage reference which is temperature compensated and radiation hardened is provided. In particular, by selectively incorporating the non-dopant atoms into the junction region of the first pn junction, such junction can be used as a forward biased junction. The predetermined lattice damage provides a predetermined decrease in minority carrier lifetime and a concomitant decrease in forward voltage of the forward biased pn junction. This lattice damage to the junction modifies the voltage response of the forward junction to neutron radiation. Thus, the forward voltage becomes less sensitive to a given level of neutron radiation. By providing the nondopant atoms to induce lattice damage in the first pn junction the necessity to dope the region with gold, as in the prior processes, is eliminated. Since only the first pn junction has selected dopant atoms incorporated into the junction, the precision voltage reference can be provided on a common substrate and thus formed as a monolithic integrated circuit.

In accordance with a further aspect of the present invention, the precision voltage reference, further has the first p-type layer and the first n-type layer disposed as an incomplete annulus of regions of material over said substrate, with the second pn junction disposed within the incomplete annular regions provided by the first p-type and first n-type layers of the first pn junction. With this particular arrangement, the devices can be provided in close proximity to one another and electrically coupled through the substrate to provide a substantially shorter electrical path between the devices and thus reduce the series resistance between the devices which is also a cause of reference voltage variations during exposure to radiation environments.

In accordance with a further aspect of the present invention, a method of fabricating a precision voltage reference includes the steps of forming a first pn junction and a second pn junction on a common semiconductor substrate with a first one of p-type regions and n-type regions of the first pn junction electrically coupled to corresponding one of p-type regions and n-type regions of the second junction through the substrate. The method further includes the steps of masking the second pn junction region while leaving the first pn junction region unmasked and directing non-dopant species towards the first pn junction to provide lattice damage in a crystal structure of the junction at the interface of the first p and first n regions of the first pn junction. With this particular arrangement, a selective, maskable technique is provided to induce a selectable level of lattice damage in the forward junction. This provides a corresponding decrease in forward voltage drop of the diode and thus effectively modifies the response of the forward junction to neutron radiation. Thus the precision voltage reference is provided having improved stability in a radiation environment. By inducing damage in the junction, a priori, that is, prior to the initiation of radiation, a high degree of stability is provided to the device since the presence of the lattice damage will make the junction less sensitive to radiation exposures. By using a maskable technique, conventional photolithographic techniques may be used to protect the reverse bias junction, that is, the second pn junction from the step of directing the high energy species toward the first junction and thus permitting the first junction characteristics to be modified without modifying the second junction characteristics.

In a preferred embodiment of the invention, the step of directing high energy species towards the first pn junction is provided by the step of implanting ions to provide clusters of displaced atoms at the first pn junction. Preferably, the implanted ions include non-dopant ions such as silicon, neon, helium, argon, carbon, fluorine, hydrogen, and nitrogen. More preferably, the implanted ions are silicon, neon, and helium.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Fabrication of a precision voltage reference as a monolithic integrated circuit having selectively induced radiation compensation will be described in conjunction with FIGS. 1-8. Although the device to be described is based upon the use of a p-type doped silicon substrate material, it is to be understood that other substrate materials such as gallium arsenide, as well as n-type doped silicon substrate materials may alternatively be used. In particular, for the device to be described herein, the equivalent device can be provided as an n-type silicon substrate material by reversing each of the dopant conductivities to be described herein and the voltage polarities provided to the device, as will be described in conjunction with FIG. 9.

Figure 1:
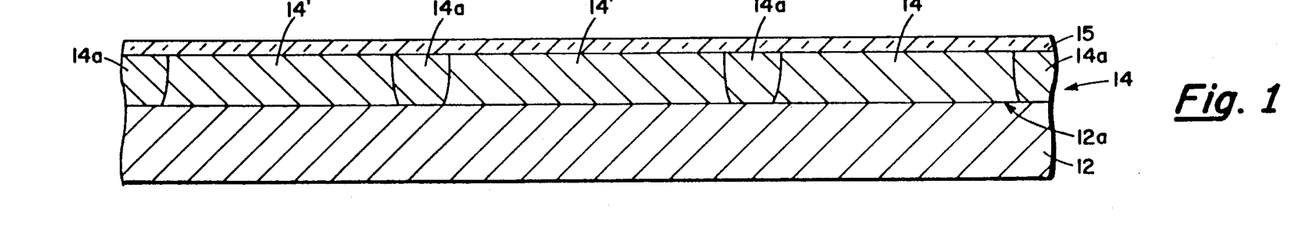
FIGS. 1-7 are a series of cross-sectional views showing selective steps in fabricating a precision voltage reference in accordance with the present invention.

Referring now to FIG. 1, a substrate 12 comprised of silicon here doped p+ type with a suitable p-type dopant such as boron to a concentration in the range of typically $5 \times 10^{18}$ to $10^{19}$ atoms/cc or greater is shown to have disposed over a first surface 12a thereof a layer 14. Here layer 14 is an epitaxially grown layer also of silicon also doped p-type generally having the characteristic of a p dopant profile. A preferred range of dopant for layer 14 is $0.9 \times 10^{16}$ a/cc to $1.1 \times 10^{16}$ a/cc with $1 \times 10^{16}$ a/cc being a typically preferred value.

Disposed over layer 14 is an oxide layer here a thermally grown oxide layer of $SiO_x$ where x may or may not be stoichiometric (here x=2). Layer 15 is typically provided by heating layer 14 in a wet oxygen ambient atmosphere to a temperature of typically 1000° C. Layer 15 is generally provided having a thickness of 1200Å although any thickness in the range of 500Å to 3000Å may be used.

Layer 14 is further provided with selectively doped p-type regions using conventional implant or diffusion techniques. Thus, although not shown but which would be apparent to one of ordinary skill in the art, selective masking layers are disposed over the upper surface of layer 14 and are patterned to expose underlying portions of the surface thereof such that additional p-type dopant material such as boron or boron difluoride ($BF_2$) can be selectively introduced to provide regions 14a. In general, masked regions 14, of layer 14 are as deposited p type silicon, whereas regions 14a are typically heavily doped p− type silicon having a dopant concentration in the range of $3 \times 10^{18}$ a/cc to $6 \times 10^{18}$ a/cc with $5 \times 10^{18}$ a/cc being a preferred value. Region 14a is here provided to prevent the formation of surface conducting channels between the two junctions which would compromise PVR voltage stability.

The p-doping should be much lower than the doping concentration of the p+ region 14a so that the breakdown of the reverse-biased diode will be confined to the n+/p+ regions. Thus, the voltage across the junction is set by the n+ and p+ doping and the area of the p+ region. Each of these features are easily controlled during processing of the devices. Furthermore, current conduction occurs in the bulk, away from the Si-SiO$_2$ interface (layers 14, 15'), so that the voltage across the diode (not shown) is immune to surface effects which may be due to carrier injection into the oxide (a normal consequence of device operation) or radiation effects. If the n+ regions (not shown) were formed in a uniform p+ region, the breakdown would occur at the edges of the n+ region, where the electric fields are higher due to the curvature of the junction.

As will be described in conjunction with FIG. 8, the forward biased diode is provided as an annular junction about a central, second diode. That is, regions 14' and 14a are provided as incomplete and concentric annular regions or rings about a central, preferably circular, region (not numbered). Alternatively, the PVR may be provided as two diodes provided side by side on the substrate and disposed to occupy substantially rectangular plan areas. That is, rather than the junctions being circular they may be straight or linear.

Figure 2:
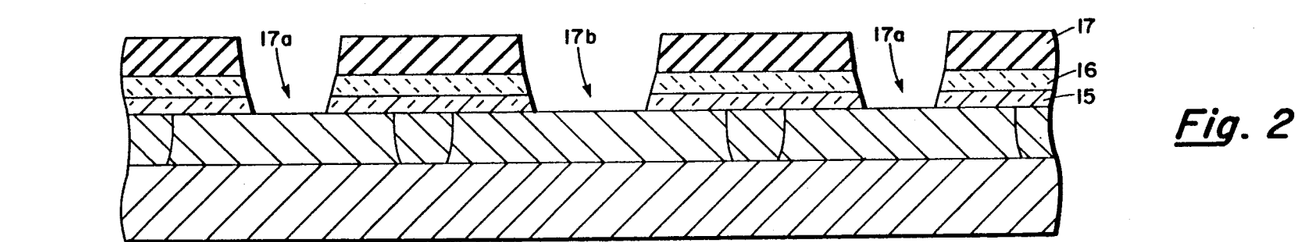

Referring now to FIG. 2, a layer 16 of an undoped glass (i.e. amorphous $SiO_x$) is deposited by any known technique over layer 15 (FIG. 2). Here a low pressure chemical vapor deposition technique is used. After deposition of the undoped glass layer 16, a masking layer (not numbered) is disposed over the undoped glass layer 16 and is patterned to provide patterned masking layer 17 having openings 17a and 17b selectively exposing (not shown) underlying portions of the undoped glass layer 16. The aperture 17a here is an incomplete annular aperture disposed about aperture 17b. After patterning of masking layer 17, exposed portions of the undoped glass layer 16 and underlying portions of thermal oxide layer 15 are selectively etched away leaving exposed portion of layer 14, as shown.

Figure 3:
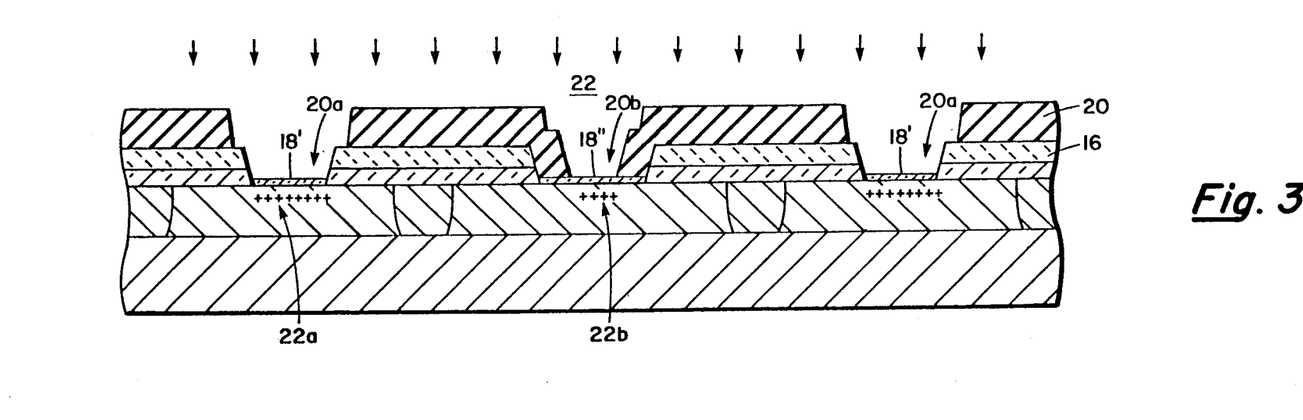

Referring now to FIG. 3, in said exposed portions of layer 14, where the previously etched away layers had resided, thin oxide layers 18', 18" are provided typically by thermally oxidizing the exposed surface of layer 14 in a dry oxygen atmosphere at a temperature of 900° C., and here to a thickness of 200Å or generally less than the thickness of layer 15. Thereafter, a new masking layer 20 is disposed on layer 16. Layer 20 is patterned to expose portions of the thin oxide layers 18' and 18", A first aperture 20a, an incomplete annulus disposed about a second, central aperture 20b is provided with a transversal width such that all of the underlying thin oxide layer 18', as well as adjacent portions of layer 16 and 15, are exposed. Conversely, only a central portion of thin oxide layer 18" is exposed by aperture 20b. The aperture 20b is smaller than 18" by a sufficient amount so that the final p+ region 14d will be contained laterally within 18" when lateral diffusion from pocket 22b occurs. Worst-case misregistration between 18" and 20, and worst-case dimensional tolerances are taken into account when determining the dimension of aperture 20b. (Typically, the radius of the aperture 20b is 10 μm less than that of 18" which is about 90 μm.) The substrate is placed in an implantation field 22 of a suitable p-type dopant such as B or $BF_2$ and selective pockets 22a, 22b of said dopant are incorporated into the layer 14, as shown.

Figure 4:
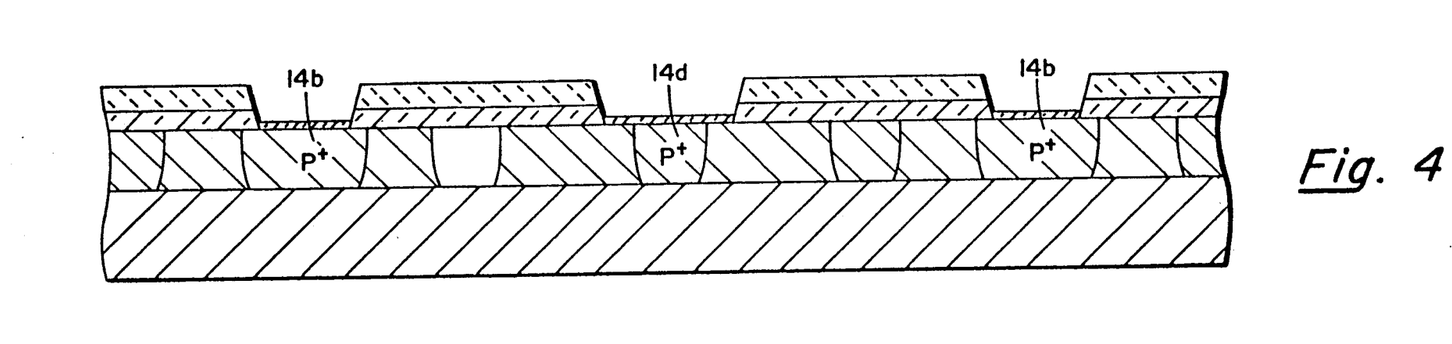

Referring now to FIG. 4, substrate 12 is shown having p+ type regions 14b, 14d provided from the pockets 22a, 22b (FIG. 3). Regions 14b, 14d are provided by annealing substrate 12 after implantation of the B or $BF_2$ dopant species. Typically, annealing occurs at a temperature in the range of 950° C. to 1050° C. for 24 hours. Other conditions may be used. As a result, the pockets 22a, 22b are driven through layer 14 to provide the regions 14b, 14d, as shown. Regions 14b, 14d are p+ type and typically doped to a dopant concentration in the range of $1 \times 10^{18}$ a/cc to $3 \times 10^{18}$ a/cc. A typical dopant concentration for regions 14b, 14d is around $2 \times 10^{18}$ a/cc. Layer 14d, although being similarly doped as layer 14b, is physically separate from layer 14b, as will be described in conjunction with FIG. 7.

Figure 5:
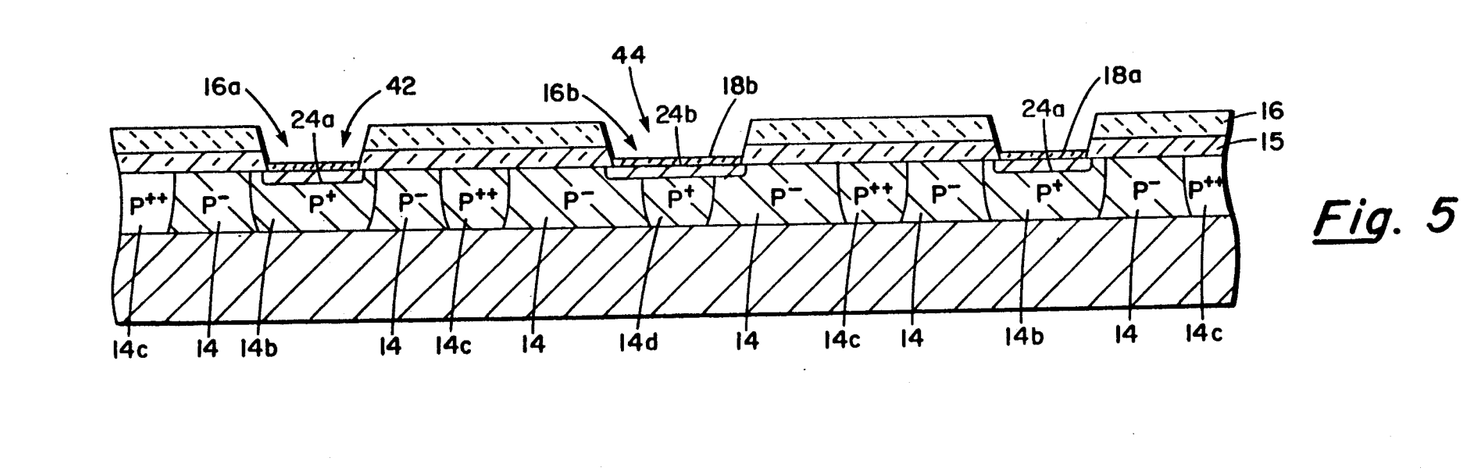

Referring now to FIG. 5, regions 24a, 24b are shown and are selectively doped by ion implantation with an n-type dopant such as arsenic or phosphorus. Typically regions 24a, 24b are doped to a concentration in the range of $5 \times 10^{19}$ a/cc to $1.5 \times 10^{20}$ a/cc with $1 \times 10^{20}$ a/cc being a preferred value. Regions 24a, 24b are defined by openings 16a, 16b provided in layers 16 and 15, as shown. Here, since the opening 16a is an incomplete annulus, as will be described in conjunction with FIG. 8, region 24a is likewise an incomplete annulus. After implanting of n-type dopants such dopants are activated by annealing the substrate at a temperature of 600° C. for 60 minutes followed by an anneal at 1000° C. for 40 minutes. This activates the n+ dopant and anneals out lattice damage caused by the implant process thus providing regions 24a, 24b.

N-type region 24a is confined completely within region the p+ type doped region 14b whereas n-type region 24b extends beyond the underlying p+ type doped region 14d, as shown. This arrangement also prevents the formation of an n+/p− parasitic diode, which would steal current from the intended n+/p+ diode. This arrangement is used to reduce the effect of surface states on the operation of the diodes (not numbered), as will be further described. Thus, n+ type region 24a and underlying p-type region 14b provide a first pn junction J1 and, as will be described, forward biased diode 42 whereas n+ type region 24b and underlying p+ type region 14d provide a second pn junction J2 and, as will be described, reversed biased diode 44.

Figure 6:
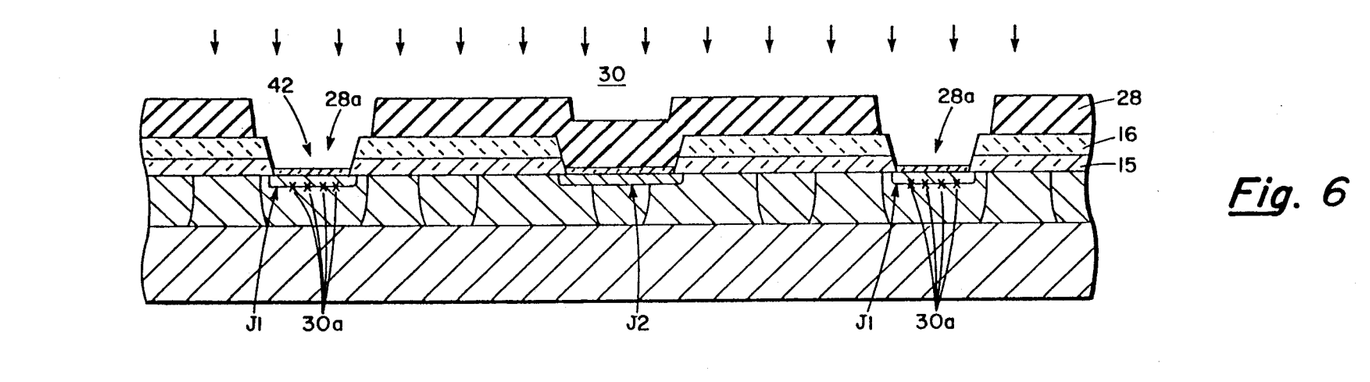

Referring now to FIG. 6, a implant mask 28 here comprised of a suitable masking material such as photoresist is disposed over glass layer 16 and is patterned to provide an annular region 28a which exposes the underlying thin thermal oxide regions 18, Masking layer 28, however, is not patterned over the central portions of the device and thus protects the junction formed by layers 24b and 14d. The aperture 28a in masking layer 28 is made sufficiently large in lateral extent compared to the opening 16a in undoped glass layer 16 to insure that the implant mask does not partially obscure the opening 16a as could possibly occur due to misalignment tolerances. This is preferred to further insure that the functional characteristics of the forward junction will be properly modified by the implantation as will no be discussed. The substrate 12 is placed in the presence of an implantation field 30 of ion, nondopant species. Such species are implanted into the underlying junction regions and provide, in response, localized lattice damage as generally denoted by 30a. Preferred species for implantation field 30 include silicon, argon, carbon, fluorine, helium, hydrogen, nitrogen, and neon. Specific implantation schedules for each of the above-mentioned species is set forth in Table I below. Other implantation schedules are possible and are principally related to the total thickness of material through which the ions must penetrate, as well as the degree and character of the damage imparted to the junction area per implanted ion.

It should be noted that the thickness of layers 15' and 16 are chosen to be sufficient to prevent implanted species from penetrating through said layers 15' and 16 and to epitaxial layer 14. The only region where implanted species 30 can penetrate, therefore, is the thin oxide region 18, overlying the forward biased junction J1. Since the same structure of layers 15' and 16 was earlier used to mask the epitaxial layer 14 during the n+ implant to provide pockets 22a, 22b and hence regions 24a, 24b, the damaged region will laterally coincide with the n+ region 24a.

TABLE I

| Species | Dose (at/cm$^2$) | Energy (KeV) |
| --- | --- | --- |
| Silicon | $1 \times 10^{13}$ | 210 |
| Argon | $7 \times 10^{12}$ | 335 |
| Carbon | $2 \times 10^{13}$ | 150 |
| Fluorine | $1.5 \times 10^{13}$ | 115 |
| Helium | $7 \times 10^{13}$ | 40 |
| Hydrogen | $3 \times 10^{14}$ | 20 |
| Nitrogen | $2 \times 10^{13}$ | 140 |
| Neon | $1.5 \times 10^{13}$ | 115 |

This schedule is selected to provide suitable damage at a junction about 200Å below a layer of silicon dioxide and 0.3 microns below the n-type silicon layer 14b. That is, it is preferred in this particular illustrative embodiment to place the atoms at the junction which is at a depth of approximately 0.32 microns.

The presence of the implanted species 30a at the junction provide predetermined lattice damage to the junction of the first diode or pn region. This damage is the damage corresponding to that which would normally be provided to that junction during a specific radiation environment exposure. With silicon, implanted silicon provides clusters of silicon atoms having energy states in the middle of the semiconductor bandgap. As a result, minority carrier lifetime is reduced within a limited depth in the silicon substrate. By appropriate choice of ion and energy levels, the region of perturbed lifetime at the junction can be selected so that it may influence the conduction mechanism of the forward biased diodes. This alters the forward junction radiation sensitivity and provides an optimized precision voltage reference which is also radiation hardened. As shown in FIG. 6, the implant damage is provided at the junction regions. I should be pointed out, however, that the implantation step as shown in FIG. 6 should be provided after the last high temperature (i.e. >600° C.) anneal cycle and before metallization layers of substantial thicknesses are provided. With respect to the former, exposure of the implanted substrate to a high temperature will cause annealing and thus removal of much of the damage induced at the junction, whereas providing metal layers of substantial thickness over the substrate will prevent implanted ions from reaching the desired location in the substrate.

Nevertheless, for certain applications it may be desirable to provide a small amount of annealing at relatively low temperatures to stabilize the defect structure by annealing out those defects prone to healing under normal storage and operational conditions. Normal healing of such defects could cause drifts in the voltage of the precision voltage reference and degradation in radiation immunity. Thus, if the junction is to typically reach an elevated temperature of 100° C. during operation, for example, then the stabilization anneal should occur at a temperature significantly above 100° C. to rapidly anneal out defects prone to healing at low temperatures, but less than 600° C. to retain a usable amount of the original implant damage at the junction. A specific stabilization anneal could be included in the process flow, but in the present case, the thermal cycles associated with subsequent processing steps—oxide deposition (420° C.), contact sinter (500° C.), hydrogen anneal (420° C.), and backside contact formation (450° C.)—are sufficient to provide the PVR with a defect structure which is sufficiently stable to provide the PVR with a 10 year operational lifetime in a typical application.

Figure 7:
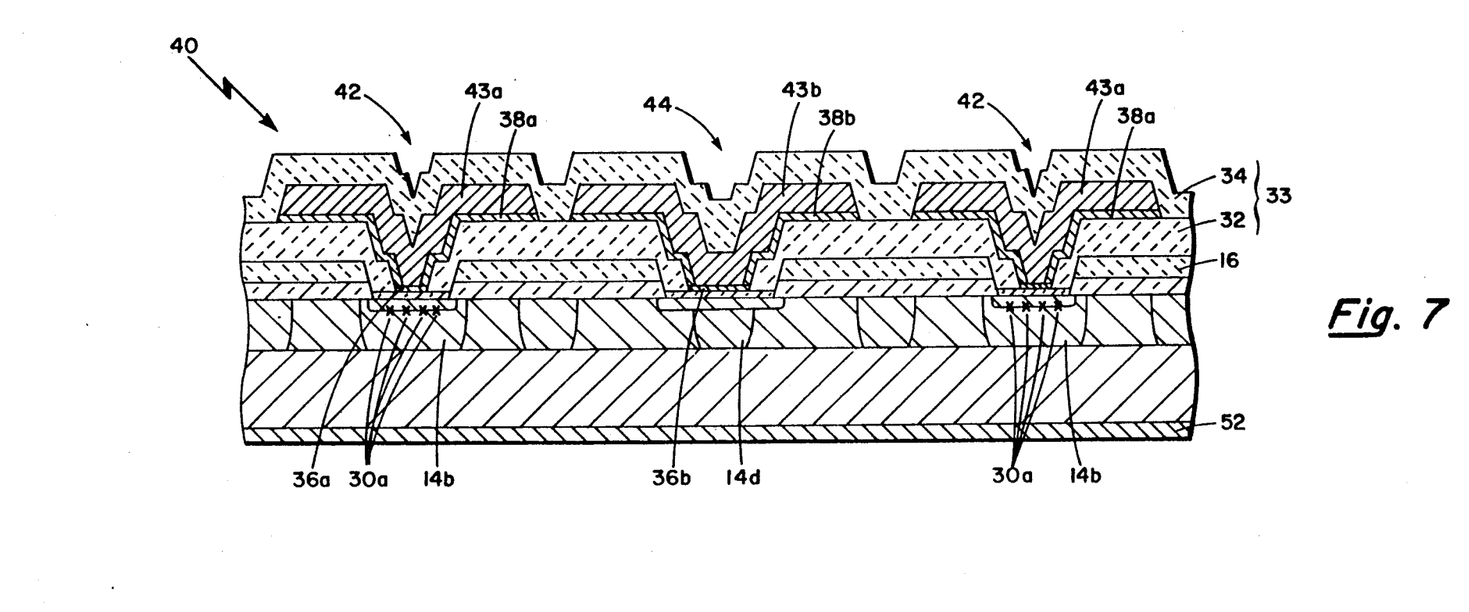

Referring now to FIG. 7, one example of a fabricated precision voltage reference 40 is shown to further include second and third layers 32, 34 of glass here each of said layers 32, 34 being doped with phosphorus providing a composite layer 33 and which are selectively deposited to passivate the device as is customary. In particular, layer 32 is provided over layer 15 and is patterned to provide windows to selectively expose underlying regions of thin oxide regions 18' and 18". Further, selective portions of the thin oxide layer 18', 18" are selectively etched away to expose underlying portions of layers 24a and 24b. A layer of platinum (not shown) is then deposited over layer 32 and within the window provided in layers 32, 18', 18" to thus contact regions 24a, 24b. The device is conventionally heated to a relatively low temperature of 500° C. to permit a platinum silicide to form and thus provide ohmic silicide contacts 36a, 36b to the n-type layers 24a, 24b. Other types of silicide contacts such as titanium and tungsten and so forth, of course, may alternatively be used. After the formation of silicide contacts 36a, 36b, the unreacted platinum layer is removed by etching the platinum in aqua regia. Next, a diffusion barrier layer (not shown) of a typical barrier material such as titanium tungsten alloy, for example, is deposited over layer 32 and is selectively patterned to provide isolated diffusion barrier regions 38a, 38b, as shown. Over layers 38a and 38b are provided aluminum contact metallizations 43a, 43b using conventional techniques such as evaporation or sputtering. Metallization layers provide external connection to the cathodes of the first and second pn junction 42, 44, respectively. After fabrication of metallization layers 43a, 43b, the layer of doped glass 34 is deposited over device 40 to completely isolate the device as thus shown.

Figure 8:
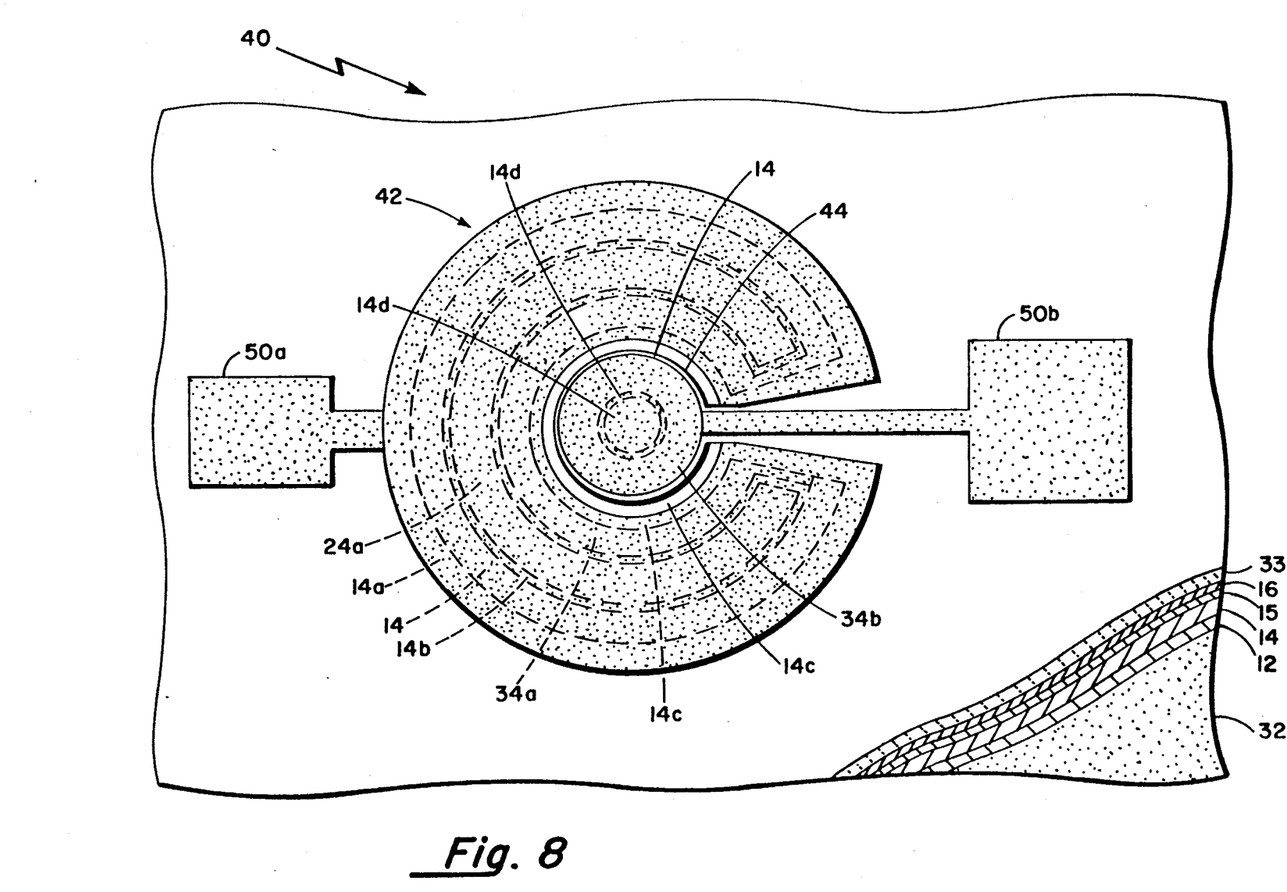
FIG. 8 is a plan view of the device of FIG. 5 taken along line 8—8 of FIG. 7.

Referring now to FIG. 8, the precision voltage reference 40 is shown formed on the substrate 12 having the epitaxially layer 14, oxide layer 15', undoped glass layer 16, and composite doped glass layer 33 (layers 32 and 34, FIG. 7). Here the precision voltage reference diodes 42, 44 are provided as a pair of concentric diodes with here the forward biased diode 42 provided as an incomplete annulus disposed about the central or reversed biased diode 44. This arrangement provides a shorter electrical connection between the anodes of the forward bias diode and reverse bias diode thus mitigating the amount of series resistance between the two diodes. A relatively large amount of series resistance will increase the noise of the diode and thus reduce its stability both as a function of variations in temperature, as well as during exposure to a radiation environment. As also shown in conjunction with FIG. 8, the annular semiconductor regions of diode 42 which are disposed about diode 44 are an incomplete annulus permitting connection to the cathode of the second diode 44. Further, the annular regions 14a, 14, and 14b (FIG. 1 and FIG. 6) are terminated such that region 14a is coupled to corresponding doped region 14c at the portion of the diode 40 where the annulus diode 42 is incomplete. Similarly, regions 14b are coupled together to confine region 16a and region 14 is coupled together with corresponding region 14 on the opposing side of layer 16a.

Contacts 50a and 50b are also provided typically during the same metal fabrication processes used to form layers 30a and 30b. Contact 50a is coupled to metal layer 43a whereas contact 50b is coupled to metal layer 42b. Conventional masking and etching processes are used to provide openings in the glass layer 42 over metal contacts 50a and 50b which permit attachment of metal bond wires to contacts 40a and 40b required to provide access to these contacts when the device is packaged. Contacts 50a and 50b are specifically provided away from the junction areas to prevent damage to the junctions which may be caused by the bonding operation. An optional ground plane conductor (FIG. 5 and FIG. 6) 52 is disposed on the backside of the substrate using conventional low temperature (i.e. less than 450° C.) techniques. It is also noted that often the substrate connection (i.e. the connection between the two anodes) is left floating (i.e. not connected to a potential).

Figure 9:
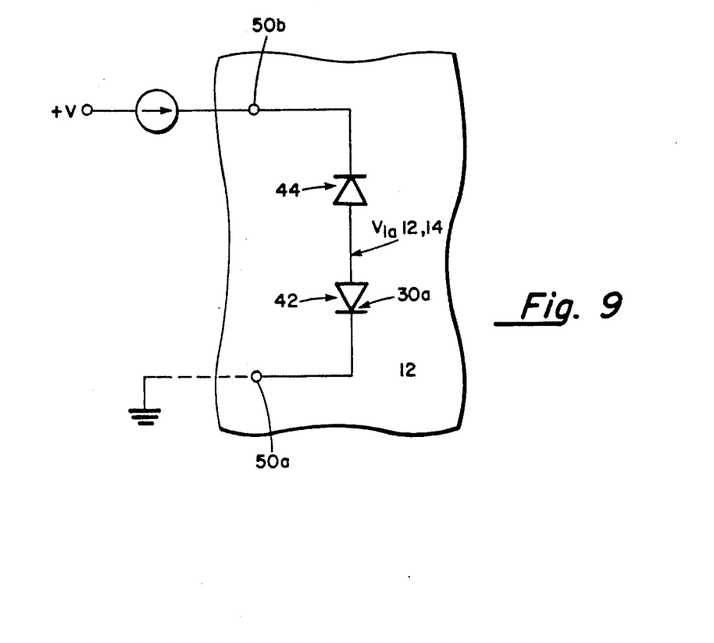
FIG. 9 is a schematic representation of the precision voltage reference in accordance with the present invention.

Referring now to FIG. 9, a schematic representation of the device of FIG. 8 is shown to include a terminal 50a supported on substrate 12 coupled to a first diode 42 which is here a forward bias diode and thus corresponds to the outer annular diode region 42 of FIG. 8. The forward bias diode 42 has a region in the junction area having a predetermined lattice damage and clusters of, here, silicon atoms 30a disposed therein and as described above. Diode 42 is electrically connected to a reverse bias diode 44 via portions of substrate 12 as is illustrated in conjunction with FIG. 7. That is, the electrical path is provided between anode regions 14b and 14d through substrate layer 12 and optional conductor 52. The second diode 44, here the reverse biased diode 44 has its cathode coupled to a second terminal 50b disposed on substrate 12. In operation, terminal 50b is connected to a positive voltage potential and terminal 50a is connected to a negative voltage potential and typically to a reference potential such as ground. At terminal 50b is provided a constant voltage which is substantially invariant with changes in temperature, as well as being substantially invariant with relatively high neutron fluence levels typically greater than $10^{15}$ a/cm$^2$.

Figure 10:
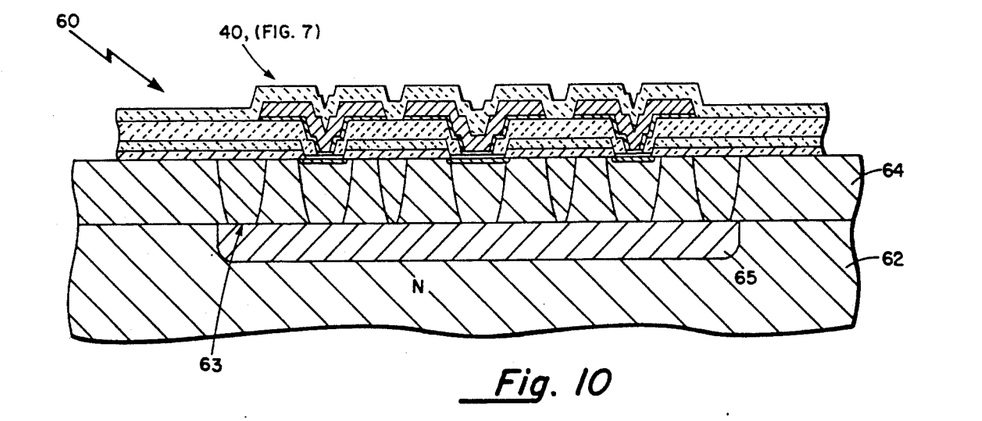
FIG. 10 is a cross-section view of monolithic precision voltage reference incorporated into a larger monolithic integrated circuit.

Referring now to FIG. 10, a precision voltage reference 40, as described in FIGS. 1-8, is shown incorporated as part of a larger monolithic integrated circuit 60. In particular, the integrated circuit 60 includes the precision voltage reference 40 generally described in conjunction with FIGS. 7 and 8 and other semiconductor circuits (not shown) such as, for example, bipolar transistor and complementary metal oxide semiconductor transistors (CMOS) generally referred to as (BiCMOS) circuits which may be arranged to provide a digital-to-analog converter and analog-to-digital converter or other functional integrated circuits. The integrated circuit 60 includes a substrate 62 here also comprised of silicon and here, for example, being doped n-type. Within substrate 62 ar typically provided so-called "p-type wells" which are used to isolate various parts of the integrated circuit, particularly if the integrated circuit is a BiCMOS circuit (i.e., bipolar transistor and CMOS transistor on a common substrate). P-well 63 is here shown isolating portions of an n-type epitaxial layer 64 disposed on substrate 62. Here the p-well is used to provide the p-type epilayer (14 FIG. 1) of the precision voltage reference. The fabrication steps for the precision voltage reference located in the p-well 63 are otherwise similar to the fabrication steps described in conjunction with FIGS. 1-8, except that the substrate 62 has an n-type dopant. Accordingly, a buried p++type layer 65, for example, may be provided under the p-type well 63 formed in the n-type epitaxial layer 64 to reduce the parasitic series resistance between the forward and reverse biased junction. By using the p-well 63 in the BiCMOS integrated circuit, as the p-type material for a precision voltage reference, such a reference may be incorporated into part of a larger circuit such as an analog-to-digital converter or digital-to-analog converter without substantially increasing the size of the circuit or interfering with the normal operation of the circuit. Thus this arrangement provides a complete monolithic built-in voltage reference and functional circuit arrangement.

An equivalent PVR could also be provided in an n-well on a p-substrate by reversing each of the dopant polarities and reversing the voltage applied to the device.

Further, although the PVR has preferably been described as having an incomplete circular or annular plan view geometric arrangement, it should be understood that a linear or straight arrangement could also be used. To accomplish this, each of the masking patterns used to define the respective structures would have or define rectangular regions rather than incomplete annulus regions. The basic fabrication techniques would otherwise be the same as described above.

In general, due to variations in a particular semiconductor process, as well as differences between semiconductor processes of different vendors, some empirical characterization of the effects of implant damage on junction voltages is preferably performed to achieve optimal radiation and temperature compensation. For example, for the reversed biased junction, the change in breakdown voltage as a function of radiation dosage is obtained for various breakdown voltages. Similar data is also obtained for the forward biased junction. For a given level of radiation tolerance, the appropriate dosage level of damage to the forward biased junction is matched to that of the appropriate reversed biased junction to provide the PVR with a radiation tolerance. To provide a temperature compensated PVR, similar data on the effects of forward and reversed voltage changes as a function of temperature for junctions having particular radiation damage are also obtained. Again, the appropriate dosage level, considering both radiation damage and temperature variations for the forward biased junction, is matched to a corresponding one for the reversed biased junction.

Further, to achieve optimal radiation and temperature compensation, it may be preferable to optimize the PVR in relation to the junction are of each of the diodes and the current density or, more particularly, the operating current through the PVR. In general, one of skill in the art would understand that variations in response to temperature changes and radiation exposure may be optimal for a particular operating current level through the PVR.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:
1. A precision voltage reference comprising:
a substrate;
a first pn junction region disposed on said substrate said first pn junction region comprising a first layer of p-type doped material and a first layer of n-type doped material disposed with the p-type doped material to provide said first pn junction with said pn junction having selectively non-dopant atoms or species provided to induce a predetermined lattice damage at said first pn junction;

a second pn junction disposed on said substrate adjacent to said first pn junction comprising a second layer of p-type material and a second layer of n-type material disposed with said p-type material to provide said second pn junction with a first one of said second p-type and second n-type layers of said second junction electrically coupled to the corresponding layers of said first pn junction through said substrate.

2. The precision voltage reference, as recited in claim 1, wherein said first p-type layer is an incomplete annulus of p-type material disposed over said substrate and said first n-type layer is an incomplete annulus layer of n-type material disposed over said substrate and with said second pn junction disposed within a region confined by the incomplete annuluses of said first p-type material and first n-type material.

3. The precision voltage reference, as recited in claim 2, wherein the non-dopant species is selected from the group consisting of silicon, argon, carbon, fluorine, helium hydrogen, nitrogen, and neon.

4. The precision voltage reference, as recited in claim 3, further comprising:
means for providing lateral electrical isolation between said first pn junction and said second pn junction.

5. The precision voltage reference, as recited in claim 2, further comprising:
means for providing lateral electrical isolation between said first pn junction and said second pn junction.

6. The precision voltage reference, as recited in claim 5, wherein said first n-layer of said first pn junction is confined within a region of said first p-type layer of said first pn junction.

7. The precision voltage reference, as recited in claim 5 wherein said second n-type layer of said second pn junction extends beyond the region occupied by said second p-type layer of said second pn junction.

8. The precision voltage reference, as recited in claim 3, wherein said substrate is p-type and said reference further comprises a p-type layer disposed over the substrate having p-type regions of selective dopant concentration.

9. The precision voltage reference, as recited in claim 3, wherein said substrate is an n-type substrate.

10. The precision voltage reference, as recited in claim 2, further comprising:
a pair of ohmic contacts disposed on said first and second n-type layers.

11. The precision voltage reference, as recited in claim 10, wherein each of said ohmic contacts comprises a silicide.

12. The precision voltage reference, as recited in claim 10, further comprising:
an electrode disposed over said ohmic contact comprising a diffusion barrier layer and a layer of aluminum disposed over said diffusion barrier and said silicide contact.

13. The precision voltage reference, as recited in claim 12, wherein said diffusion barrier is a titanium/tungsten alloy.

14. The precision voltage reference, as recited in claim 13, further comprising:
a layer of an oxide disposed on said p-type layer.

15. The precision voltage reference, as recited in claim 14, further comprising:
an undoped layer of glass disposed between said layer of oxide.

16. The precision voltage reference, as recited in claim 15, further comprising:
a doped layer of glass disposed between said undoped layer of glass and said contacts.

17. The precision voltage reference, as recited in claim 16, further comprising:
a second layer of doped glass disposed over said contacts and on portions of said first layer of doped glass.

18. The precision voltage reference, as recited in claim 16, further comprising:
regions of an oxide of said p-type layer disposed on portions of said n-type contacts, said ox ice regions having thicknesses substantially thinner than the thickness of said oxide layer.

* * * * *